United States Patent [19]
Chao et al.

[11] 4,413,330
[45] Nov. 1, 1983

[54] APPARATUS FOR THE REDUCTION OF THE SHORT-CHANNEL EFFECT IN A SINGLE-POLYSILICON, ONE-DEVICE FET DYNAMIC RAM ARRAY

[75] Inventors: Hu H. Chao, Yorktown Heights; Robert H. Dennard, Cortlandt, both of N.Y.

[73] Assignee: International Business Machines Corporation, Armonk, N.Y.

[21] Appl. No.: 280,143

[22] Filed: Jun. 30, 1981

[51] Int. Cl.³ .......................................... G11C 11/40
[52] U.S. Cl. .................................... 365/205; 365/203
[58] Field of Search ............. 365/202, 203, 205, 208, 365/149

[56] References Cited

U.S. PATENT DOCUMENTS 3,986,180 10/1976 Cade .................................... 365/104
4,103,342 7/1978 Miersch et al. ..................... 365/149

OTHER PUBLICATIONS

"A 34 μm² DRAM Cell Fabricated with a 1 μm Single-Level Polyoide FET Technology", by H. H. Chao et al., 1981 IEEE International Solid-State Circuits Conference Digest of Technical Papers, Feb. 1981, p. 152.
"A High Performance Sense Amplifier for a 5V Dynamic RAM", by J. J. Barnes et al., IEEE Journal of Solid State Circuits, vol. SC 15, No. 5, Oct. 19, 1980, p. 831.
"Field Effect Transistor Memory", by R. Kruggel, IBM Technical Disclosure Bulletin, vol. 14, No. 9, Feb., 1972, p. 2714.
"A 64 Kb MOS Dynamic RAM", by I. Lee, et al., 1979 IEEE International Solid State Circuits Conference, Feb. 1979, p. 146.

Primary Examiner—Joseph A. Popek
Attorney, Agent, or Firm—Thomas J. Kilgannon

[57] ABSTRACT

A one-device, FET dynamic random access memory array is disclosed wherein a problem arising from the short-channel effect is reduced in single-polysilicon, one-device field effect transistor dynamic random access memory arrays where a portion of a word line is used as an electrode of a memory cell storage capacitor. When such word lines are accessed, boosted voltages can appear across the source-drain of FET devices of unaccessed memory cells causing them to conduct and spuriously lose information. This problem is minimized in such memory arrays by opening a pair of bit line switches so that the potential on an unselected bit line remains at the potential to which it was precharged. In this manner, the potential difference across the source-drain of the FETs of unselected memory cells can never exceed the potential to which all the bit lines are precharged.

15 Claims, 2 Drawing Figures

APPARATUS FOR THE REDUCTION OF THE SHORT-CHANNEL EFFECT IN A SINGLE-POLYSILICON, ONE-DEVICE FET DYNAMIC RAM ARRAY

DESCRIPTION

1. Technical Field

This invention relates to one-device, FET dynamic random access memory arrays and more particularly relates to apparatus for the elimination of the problem arising from the short-channel effect in single-polysilicon, one-device field effect transistor dynamic random access memory arrays where a portion of a word line is used as an electrode of a memory cell storage capacitor. When such word lines are accessed, boosted voltages can appear across the source-drain of FET devices of unaccessed memory cells causing them to conduct and spuriously lose information. Still more particularly, it relates to the elimination of the problem arising from the short-channel effect in such memory arrays by opening a pair of bit line switches so that the potential on an unselected bit line remains at the potential to which it was precharged. In this manner, the potential difference across the source-drain of the FETs of unselected memory cells can never exceed the potential to which all the bit lines are precharged.

2. Background Art

To the extent that a memory cell in an array of memory cells is considered apart from the other memory cells of the array, problems which might be detected if a memory cell were considered in conjunction with neighboring memory cells are often recognized in the latter stages of development and require the addition of devices and circuits to solve the problems. In many instances, problems arise when known arrays are scaled down to increase the density of a memory array. Phenomena which do not appear in a 2.5 micrometer line width technology, for example, come into play when a 1.0 micrometer line width technology is used. If the line width decreases and the source-drain spacing of memory cell FET devices are scaled down without similarly reducing the memory cell voltages, a phenomenon known as the short-channel effect appears as a result of boosted voltages on a memory cell storage capacitor, for example, and particularly where the memory cell word line is used as an electrode of the storage capacitor. The short-channel effect comes about when the depletion region adjacent the drain extends into the vicinity of the source lowering the threshold of the device. Under such circumstances, the FET device is rendered conductive and information stored on an associated capacitor is discharged spuriously to ground.

In a known commercially available 64-K bit chip, a dense memory array was implemented using a single layer of polysilicon. In the array, the storage capacitor for one memory cell uses the adjacent wordline for a capacitor electrode. Using an approach called the "folded bit line" approach, adjacent pairs of bit lines are connected to a sense amplifier which acts on the differential signal between the two lines and sensing is carried out in the usual well known manner. However, when writing or regeneration of a destructively read-out memory cell takes place by energizing selected word and bit lines, information stored in memory cells associated with the selected word line and unselected bit lines can be lost due to the short-channel effect. This is particularly so in dense FET memory arrays where a minimum spacing between source and drain of the cell FET devices contributes greatly in the achievement of high density. If the FET of the memory cell has a minimum spacing between drain and source, the depletion region from the drain with the large applied voltage will, as indicated above, extend into the vicinity of the source and lower the switching threshold of that device. This is the short-channel effect and, under such circumstances, the device subjected to a high potential between its source and drain can conduct, discharging its serially disposed storage capacitor and, in this way, lose data which should have been retained. This problem will become clear when the prior art memory array shown in FIG. 1 is discussed in more detail hereinafter. To the extent that the short-channel effect problem exists, it can be solved by deactivating bit line switches associated with the bit lines of unselected memory cells in a manner to be described in more detail hereinafter in connection with FIG. 2.

Single-polysilicon, one-device field effect transistor memory cells are well known to those in the semiconductor memory art and are described in detail in an article entitled, "A 34 $\mu m^2$ DRAM Cell Fabricated With a 1 $\mu m$ Single-Level Polyoide FET Technology" by H. H. Chao et al, 1981 IEEE International Solid-State Circuits Conference, Digest of Technical Papers, February 1981, p. 152.

The use of bit line switches is broadly shown in an aricle entitled "A High Performance Sense Amplifier For a 5 V Dynamic RAM" by J. J. Barnes et al, IEEE Journal of Solid State Circuits, Vol. SC 15, No. 5, Oct. 19, 1980, page 831. To the extent that the use of the bit line switches is in an environment where the particular problem solved (short-channel effect) by the present invention does not arise, the function of these bit line switches is entirely different.

U.S. Pat. No. 4,103,342 shows bit line switching devices wherein upper and lower portions of a pair of bit lines are simultaneously connected to a shared sense amplifier.

"Field Effect Transistor Memory" by R. Kruggel in the IBM Technical Disclosure Bulletin, Vol. 14, No. 9, February, 1972, page 2714 shows a memory array wherein the application of a potential to a word line can apply a boosted voltage to a capacitor which forms the storage element for an unselected memory cell.

The use of switched bit lines has been shown previously in an article entitled "A 64 Kb MOS Dynamic RAM" by I. Lee et al, 1979 IEEE International Solid State Circuits Conference February 1979, p. 146. The bit line switches are utilized in this article to reduce bit line capacitance.

From all the foregoing, it should be clear that while specific circuit configurations such as the shared sense amplifiers and bit line switches are known, problems associated with the short-channel effect in memory arrays which utilize single-polysilicon memory cells where the word line is used as the top electrode for the memory cell storage capacitors have not been addressed.

It is, therefore, a principal object of this invention to provide a memory array in which the problem associated with the short-channel effect is eliminated without raising the threshold value in the array devices or without increasing the drain-source spacing of these devices.

It is another object of the present invention to provide a memory array which utilizes shared sense amplifiers and sinle-polysilicon memory cells wherein the problem associated with the short-channel effect is eliminated by retaining precharge potential on the bit lines of certain unselected memory cells during read, write and refresh memory array cycles.

It is still another object of the present invention to provide a memory array in which pairs of bit lines share a single sense amplifier and wherein the unselected one of the pair of bit lines is simultaneously isolated from its associated sense amplifier and from any potential other than the potential to which all bit lines are precharged.

Yet another object of this invention is to provide a highly dense memory array wherein tradeoffs such as raising the threshold voltage of the memory cell FETs or lengthening the drain-source spacing of these devices can be avoided without impacting the density achieved by line width reduction and the attendant scaling down of other device dimensions.

BRIEF SUMMARY OF THE INVENTION

The present invention relates to single-polysilicon, one-device FET dynamic random access memory arrays which, at reduced line widths of approximately one micrometer, for example, are subject to the short-channel effect. When chip line widths are reduced, dimensions of associated devices are scaled proportionately to achieve higher density. To the extent that drain-source spacing is minimized without reducing device voltages, information in a memory cell associated with an unselected bit line can lose its information due to the short-channel effect. When the voltage difference across the source and drain exceeds a voltage to which all bit lines have been previously charged, the threshold voltage of the FET device is affected in such a way that the FET spuriously conducts causing information stored on an associated storage capacitor to be lost. In the present invention, this effect is prevented by opening up a pair of bit line switches afer the bit lines are charged to a voltage, VDD, so that the potential on unaccessed bit lines will remain at VDD and never go to zero volts. The possibility for applying potentials across the source-drain of FETs associated with unaccessed bit lines arises during read, write and refresh memory cycles. By opening up bit line switches after precharge to a voltage, VDD, unaccessed bit lines which would normally drop to ground potential are held at the potential VDD. The latter potential is then present on the source of an FET device which is connected to each of the unaccessed bit lines. In a situation where a serially disposed storage capacitor is charged up to approximately VDD, this potential appears on the drain of each of the FETs associated with unaccessed bit lines and the potential difference across the source-drain is approximately the threshold voltage, $V_t$, of the FET, more or less depending on the design of the auxiliary circuits. When writing, reading or refreshing an accessed memory cell, other memory cells having storage capacitor electrodes formed from portions of the accessed word line experience an additional voltage of approximately VDD, when the word line rises by that amount. Thus, any storage node already charged up to the potential VDD experiences an additional voltage excursion which now appears as a potential of approximately 2VDD on the drain of its associated, serially disposed FET. Since the potential of approximately VDD is already present on the source of the FET device, the potential difference across the drain-source is now held to the potential of approximately VDD and the possibility for the short-channel effect coming into play is reduced, since the boosted voltage 2VDD does not appear across the device. The implementation of the above described approach requires four switches per pair of bit lines which share a common sense amplifier. Each of the bit lines has two switches and pulsed sources are provided which activate two switches per bit line at different times. Apart from this, the operation of the memory array of the present invention is conventional.

These and other objects, features and advantages of the present invention will be more apparent from the following more particular description of a preferred embodiment.

DESCRIPTION OF A PREFERRED EMBODIMENT

Figure 1:
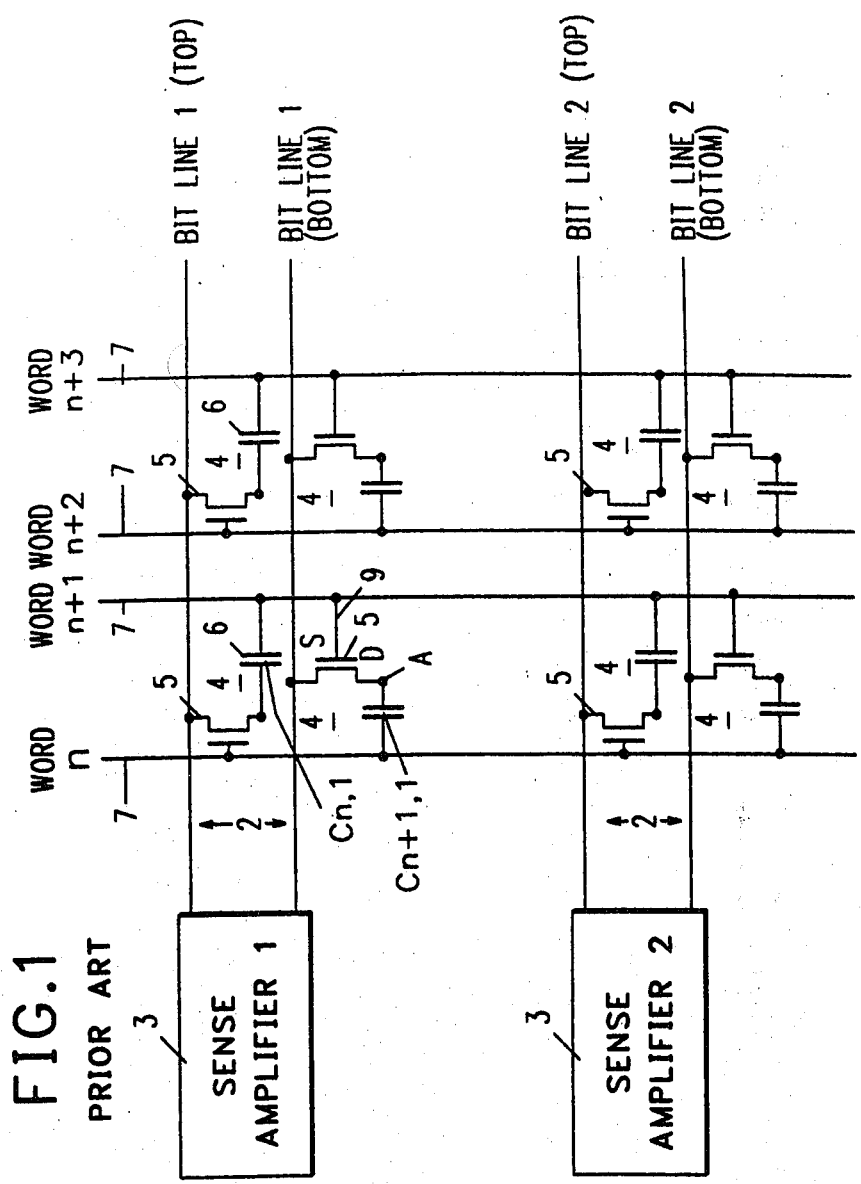
FIG. 1 is a partial schematic, partial block diagram of a prior art single-polysilicon, one-device FET dynamic random access memory array which shows how stored information may be spuriously lost if the short-channel effect is not taken into consideration. The array shown uses the folded bit line approach wherein pairs of adjacent bit lines share a common sense amplifier.

Referring now to FIG. 1 there is shown a partial schematic, partial block diagram of a prior art single-polysilicon, one-device FET dynamic random access array which shows how stored information may be spuriously lost if the short-channel effect is not taken into consideration. The array portion shown uses the well known folded bit line approach wherein pairs of bit lines share a common sense amplifier. FIG. 1 shows a portion 1 of a memory array using the folded bit line approach referred to hereinabove. In this approach, pairs of adjacent bit lines 2 are connected to sense amplifiers 3. The latter acts on the differential signal between pairs of bit lines 2 to provide an output signal.

In FIG. 1, memory cells 4 each consisting of a single n-channel field effect transistor 5 and charge storage capacitor 6 connected in series are disposed between each of the bit lines of each pair of bit lines 2 and an associated word line 7. In FIG. 1, the uppermost pair of bit lines 2 are otherwise identified as Bit Line 1(TOP) and Bit Line 1(BOTTOM) while the lowermost pair of bit lines 2 is otherwise identified as Bit Line 2(TOP) and Bit Line 2(BOTTOM). Also, word lines 7 are otherwise identified from left to right in FIG. 1 as Word n, Word n+1, Word n+2 and Word n+3. Thus, upper leftmost memory cell 4 has the source electrode of transistor 5 connected to Bit Line 1(TOP) while its drain is connected to one electrode of capacitor 6. The other electrode of capacitor 6 is connected to Word n+1. The gate electrode 8 of transistor 5 of upper leftmost memory cell 4 is connected to Word n. Each memory cell 4 in the uppermost row of memory cells 4 is similarly connected to Bit Line 1(TOP) and adjacent word lines 7 such as Word n+2, Word n+3.

The other of the uppermost pair of bit lines 2, namely Bit Line 1(BOTTOM), is connected to the source electrode S of transistor 5 of memory cell 4 which is disposed immediately beneath upper leftmost cell 4 in FIG. 1. The drain electrode D of the same transistor 5 is connected to one electrode of its associated capacitor 6 via node A while the other electrode of capacitor 6 is connected to Word n. Gate electrode 9 of the same transistor 5 is connected to Word n+1. Every other memory cell 4 in the same row is similarly connected to Bit Line 1(BOTTOM) and a different pair of associated word lines 7.

Considering now memory cells 4 connected to Bit Line 2(TOP) and Bit Line 2(BOTTOM), these memory cells 4 are connected in the same manner as memory cells 4 connected to Bit Line 1(TOP) and Bit Line 1(BOTTOM), respectively.

The array portion 1 of FIG. 1 operates as follows during a read portion of the memory cycle. When a given word line 7 is selected, Word n for example, a capacitor 6, capacitor Cn,1 for example, of upper leftmost memory cell 4 is connected via the serially disposed conducting transistor 5 to Bit Line 1(TOP).

A signal appears on Bit Line 1(TOP), depending on the stored voltage state of capacitor Cn,1 and a differential sense signal is developed making use of a dummy cell (not shown) with half the stored charge on Bit Line 1(BOTTOM) in the usual well known manner. However, when Word n is selected and connects memory cell capacitor Cn,1 to the uppermost of sense amplifiers 3, it also couples a positive going signal into the storage node A of memory cell 4 immediately beneath upper leftmost memory cell 4. Storage node A is disposed between transistor 5 and a capacitor 6 otherwise identified in FIG. 1 as Cn+1,1. The latter is accessible through the serially disposed transistor 5 which is gated via Word n+1 and gate 9. Word n+1 is held at ground potential. After the sense operation is complete, the data being read is normally regenerated or refreshed by placing a positive potential on Bit Line 1(TOP) so that the data can be rewritten into storage capacitor Cn,1 via its associated FET transistor 5 which is still conductive as a result of a positive potential on its gate 8. At the same time, the complementary (ground level) signal is developed on the opposite side of the sense amplifier latching circuit and applied to Bit Line 1(BOTTOM). The FET transistor 5 accessing node A and capacitor Cn+1,1 now has a grounded source S and a large voltage on its drain D since node A (to which it is connected) has been boosted to a relatively large value due to the accessing of Word n for rewriting data into capacitor Cn,1. If transistor 5 connected to node A has a sufficiently small spacing between drain and source, the depletion region from drain D with its large applied voltage will extend into the vicinity of source S and lower the switching threshold of that device (short-channel effect). The threshold of that transistor 5 must then be designed to be sufficiently high, so that it will remain turned off under this condition to prevent discharging of the voltage stored on node A. Thus, if the voltage VDD is applied to Word n and capacitor Cn+1,1 is storing a binary "1" represented by a voltage of approximately VDD, the voltages are additive and a potential of approximately 2VDD appears across the drain-source of transistor 5 associated with capacitor Cn+1,1. If that transistor conducts, the voltage on capacitor Cn+1,1 is discharged and the information is lost.

In a normal memory array, the threshold value of the FETs of the memory cells must be of the order of one volt to keep these devices turned off completely under worse case manufacturing tolerance conditions. This includes an allowance for some lowering of the threshold (typically by about 0.2 volts) when a memory cell has a high stored voltage applied to the drain of the FET. However, the boosting of the memory cell voltage which is inherent in the single-polysilicon layer memory cell of the array of FIG. 1 causes additional lowering of the threshold voltage by as much as 0.2 volts in a minimum channel length FET device. To compensate for this would require either raising the threshold value in the array devices or lengthening the drain-source spacing to eliminate the short-channel effect. The first alternative causes a loss in charge stored in the capacitor due to the larger threshold drop across the device during writing unless a larger word line voltage is employed which also has disadvantages. The second alternative causes a loss in density due to the larger (perhaps twenty to third percent) channel length; increases the capacitive loading on the word line due to the resulting larger gate area, and increases the bit line capacitance due to the larger cell size. To the extent that the above described alternatives impose penalties, the solutions are unsatisfactory. The memory array shown in FIG. 2 solves the problem arising from the short-channel effect without imposing undue restraints on the resulting memory array.

Figure 2:
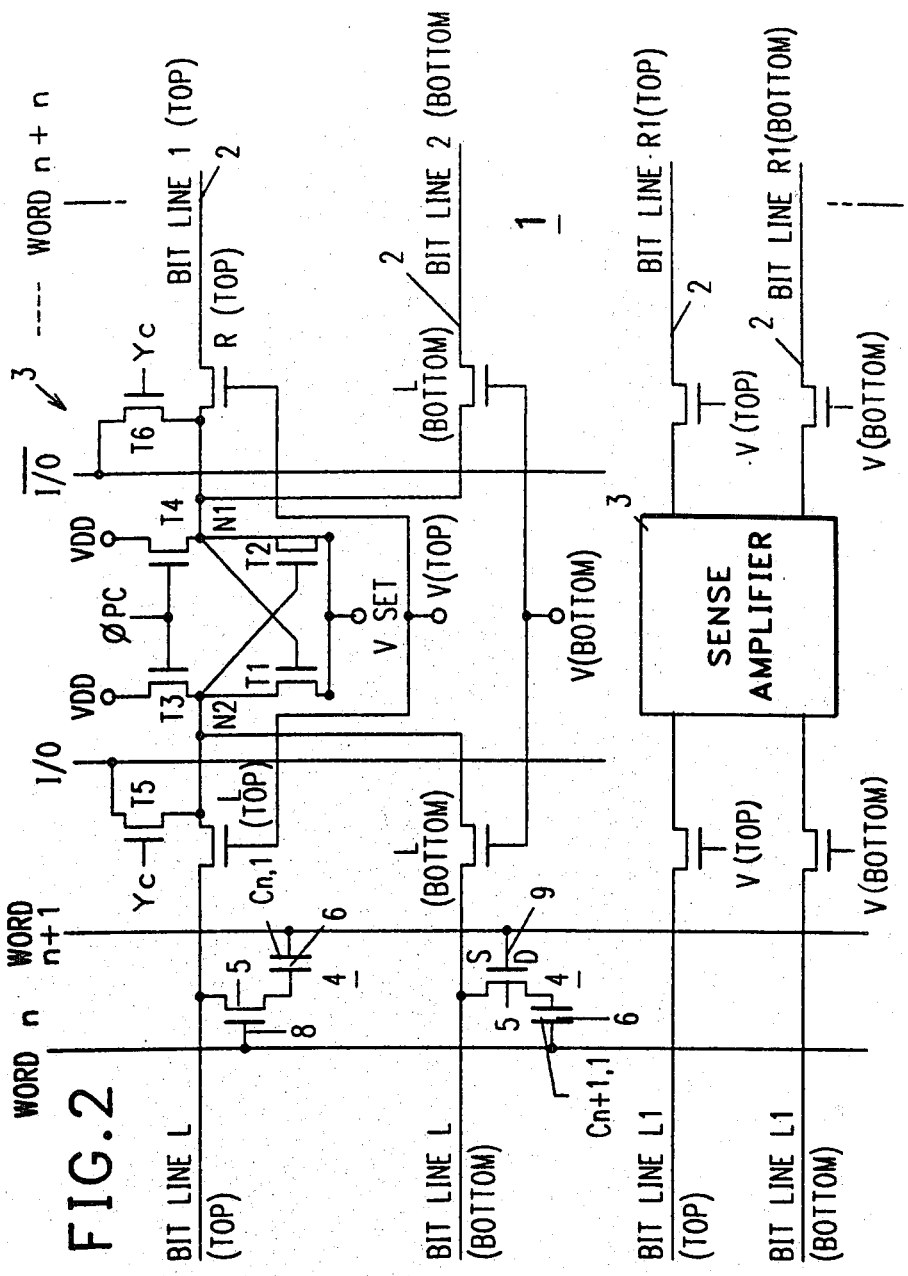
FIG. 2 shows a partial schematic, partial block diagram of a single-polysilicon, one-device FET dynamic random access memory array wherein bit line switches are utilized to eliminate the problem arising from the short-channel effect. In the arrangement of FIG. 2, portions of pairs of bit lines are symmetrically arranged about and share the same sense amplifier and portions of the word lines are utilized as the top electrode of each memory cell storage capacitor.

Referring now to FIG. 2, there is shown a partial schematic, partial block diagram of a single-polysilicon, one-device FET dynamic random access memory array wherein bit line switches are utilized to eliminate the problems arising from the short-channel effect. FIG. 2 shows a portion of a memory array 1 wherein portions of pairs of bit lines are symmetrically arranged about and share the same sense amplifier and in this respect differs from the folded bit line approach as shown in FIG. 1. The same reference characters utilized in FIG. 1 are utilized in FIG. 2 where they refer to the same elements. The arrangements of FIG. 1 and FIG. 2 are identical in that memory cells 4 are connected to bit lines 2 and word lines 7 in the same manner. Bit lines 2 are divided, however, into the following portions: Bit Line L(TOP), Bit Line R(TOP), Bit Line L(BOTTOM), Bit Line R(BOTTOM). Each of the aforementioned bit line portions has serially disposed therein, and bit line switches L(TOP), R(TOP), L(BOTTOM), and R(BOTTOM), respectively. The bit line switches L(TOP), R(TOP), are actuated from a voltage source V(TOP) and the bit line switches designated L(BOTTOM) and R(BOTTOM) are actuated from a source V(BOTTOM). Each row of memory cells 4 has similar bit line portions and bit line switches which are actuated in the same way. In FIG. 2, sense amplifier 3 is shown in some detail to clearly demonstrate how the bit line switches function in conjunction with a standard cross-coupled sense amplifier. Sense amplifier 3 includes a pair of cross-coupled field effect transistors T1,T2 the gates of which are cross-coupled to nodes N1,N2. A pair of field effect transistors T3,T4 interconnect voltage sources Vdd with nodes N2,N1, respectively. FETs T3,T4 are actuated from a voltage source $\phi PC$ connected to the gate electrodes of devices T3,T4. A potential VSet is connected to FETs T1,T2. In addition, a pair of input/output lines, I/O and I/O which apply a signal and its complement, respectively, to Word n, Word n+1 respectively, during writing are connected via a pair of FETs T5,T6, respectively, to nodes N2,N1, respectively, of sense amplifier 3. FETs T5,T6 are actuated by a voltage source Yc connected to their gates.

In operation, the capacitance of all bit line portions is precharged to the level VDD by applying the voltage $\phi PC$ which turns on FET devices T3,T4. During the precharge cycle, bit line switches L(TOP), R(TOP), L(BOTTOM) and R(BOTTOM) are rendered conductive by applying the potentials V(TOP) and V(BOTTOM) to the appropriate associated switches. Assuming it is desired to store a binary "1" in capacitor Cn,1 by applying a positive potential to input/output line, I/O, FETs T5 and T6 are rendered conductive by the application of decoder output Yc to their gates. The conduction of FET 25 establishes a path for current flow from I/O via bit line switch L(TOP) which has been rendered conductive by the application of potential V(TOP)) and transistor 5 of memory cell 4 which is in series with capacitor Cn,1. Transistor 5 has been rendered conductive by applying the potential VDD to its gate 8 via Word n. Capacitor Cn,1 now charges up to the potential of approximately VDD.

In a similar way, a binary "0" may be stored in capacitor Cn,1 by simply applying ground potential to input/output line I/O.

To read or sense information stored on capacitor Cn,1, word line Word n is activated and node N2 of sense amplifier 3 experiences either a higher or lower potential than node N1 depending on the potential of capacitor Cn,1 which is applied to node N2 upon conduction of its associated FET 5. If a binary "1" is being sensed, the potential on node N2 is high, VDD, and device T2 of amplifier 3 is rendered conductive. Device T1 remains nonconductive because the potential on node N1 derived from a dummy cell (not shown) is insufficient to permit device T1 to conduct. With device T2 conductive, current flows via input/output line, I/O device T6, node N1 and device T2 to VSet which is at ground potential. Conversely, when node N2 is at a low potential as a result of a binary "0" being stored on Cn,1, device T1 conducts and there is current flow via input/output line, I/O device T5, node N2 and device T1 to VSet which is at ground potential. Under such circumstances, assuming that Bit Line L(BOTTOM) were directly connected to node N2, the low potential on node N2 would appear on source S of FET 5 connected to Bit Line L(BOTTOM). Again, assuming that storage capacitor Cn+1,1 is charged up to the potential of approximately VDD representing the storage of a binary "1", the potential difference across source S and drain D of the serially disposed FET 5 would be approximately VDD. However, when word line Word n is actuated for purposes of reading, writing or refreshing a memory cell associated with any of the bit lines which are designated Bit Line (TOP) and node N2 is at a low potential, the potential of approximately VDD applied to Word n becomes additive with the potential stored on capacitor Cn+1,1 and the potential of approximately 2VDD appears on drain of its serially disposed FET 5. With a low potential on source S, the source-drain potential difference is approximately 2VDD and the short-channel effect comes into play causing FET 5 associated with capacitor Cn+1,1 to conduct resulting in a spurious loss of the information stored on that capacitor.

However, by providing bit line switches in each of the bit lines as shown in FIG. 2, the unselected bit lines can be isolated from ground potential and held at the poential VDD insuring that a potential difference of no greater than approximately VDD will ever appear across the source-drain of any memory cell FET. In the instance being described, bit line switch L(BOTTOM) and R(BOTTOM) are deactivated by the removal of potential V(BOTTOM) preventing Bit Lines L(BOTTOM) and R(BOTTOM) from dropping to the low potential of node N2. Thus, source S of the serially disposed transistor 5 is always held at approximately VDD while its drain D experiences either approximately VDD when capacitor Cn+1,1 is storing a binary "0" or 2VDD when capacitor Cn+1,1 is storing a binary "1". In any case, the maximum drain-source potential difference is now always approximately VDD and the excess threshold voltage drop due to the drain-source potential difference of approximately 2VDD (the short-channel effect) is eliminated. At this point, it should be clear, that when an unselected bit line portion in any row of memory cells 4 is the bottom one of a pair of bit lines 2, all the bottom bit line switches of every other bottom bit line portions must be opened. Similarly when a top one of a pair of bit line 2 portions is unselected, all the top bit line switches of every other top bit line portions must be opened.

To the extent that the same conditions as described above occur when a memory cell 4 is being refreshed, all the unselected bit lines, either bottom or top, must have their associated bit line switches deactivated.

From the foregoing, it should be clear that the operation of sense amplifier 3 does not depart in any significant way from known sense amplifiers and, while memory cell portion 1 has been described in connection with n-channel devices, the devices utilized could be p-channel devices with departing from the spirit of the present invention. As is obvious by this time, each memory cell in array portion 1 is selected in the same way as described hereinabove and that, by describing what occurs with respect to the pair of memory cells 4 just described, the operation of similar pairs of memory cells 4 anywhere else in a memory array of the same kind has also been described. Inasmuch as the fabrication process involved in manufacturing memory arrays of the type described hereinabove forms no part of the present invention, sufficie it to say that those skilled in the semiconductor memory art would be capable of fabricating such an array by well known memory array fabrication techniques.

In an exemplary array, the potential VDD could be 5 volts and V(TOP) and V(BOTTOM) could be 7 volts.

Having thus described our invention, what we claim as new, and desire to secure by Letters Patent is:

1. A memory array comprising
   at least a pair of storage capacitors, a pair of bit lines and a pair of word lines, one and the other said pair of storage capacitors being connected at one electrode thereof by an actuable device to one and the other of said pair of bit lines and at the other electrode thereof to one and the other of said pair of word lines said other electrodes being integral with one and the other of said word lines,
   a sense amplifier responsive to the state of said pair of storage capacitors, and,
   switchable means interconnecting said sense amplifier and one and the other of said pair of bit lines for decoupling an unselected one of said pair of bit lines from said sense amplifier when one or the other of said pair of word lines is selected.

2. A memory array according to claim 1 further including means connected to one and the other of said pair of bit lines for precharging said pair of bit lines to a given value of voltage.

3. A memory array according to claim 1 wherein said actuable device is a field effect transistor.

4. A memory array according to claim 3 wherein said field effect transistor has source, drain and gate electrodes, one of said electrodes being connected to a respective one of said pair of bit lines, another of said electrodes being connected to said one terminal of a respective one of said storage elements and each said gate electrode being connected to a respective one of said pair of word lines.

5. A memory array according to claim 1 wherein each of said pair of bit lines is divided into first and second bit line portions.

6. A memory array according to claim 5 wherein each of said first and second bit line portions includes a switchable means for decoupling an unselected one of said pair of bit lines from said sense amplifier when one or the other of said pair of word lines is selected.

7. A memory array according to claim 6 wherein said first bit line portion of said pair of bit lines are connected to an input of said sense amplifier and said second bit line portions of said pair of bit lines are connected to another input of said sense amplifier.

8. A memory array according to claim 7 wherein said switchable means interconnecting said sense amplifier and one and the other of said pair of bit lines includes a switchable field effect transistor disposed in each of said first and second bit line portions.

9. A memory array according to claim 1 wherein said sense amplifier is a cross-coupled field effect transistor amplifier the nodes of which are connected to said pair of bit lines.

10. A memory array according to claim 1 further including means connected to said pair of bit lines for selecting one or the other of said pair of bit lines.

11. A memory array according to claim 1 further including means connected to said pair of word lines for selecting one or the other of said pair of word lines.

12. A memory array according to claim 1 wherein said switchable means for decoupling is a field effect transistor.

13. A memory array according to claim 1 wherein said switchable means for decoupling includes at least a field effect transistor serially disposed in each of said pair of bit lines.

14. A memory array according to claim 13 wherein each said field effect transistor includes a gate electrode and further includes means coupled to each said gate electrode for actuating said at least a field effect transistor which is serially disposed in the selected bit line when one or the other of said pair of bit lines is selected.

15. A memory array according to claim 1 further including means connected to said switchable means for actuating said switchable means associated with said selected bit line when one or the other of said pair of bit lines is selected.

* * * * *